(12) United States Patent
El-Aini et al.

(10) Patent No.: US 8,600,707 B1
(45) Date of Patent: Dec. 3, 2013

(54) PROCESS FOR ANALYZING A LABYRINTH SEAL FOR FLUTTER

(75) Inventors: Yehia El-Aini, Tequesta, FL (US); William B Diggs, West Palm Beach, FL (US)

(73) Assignee: Florida Turbine Technologies, Inc., Jupiter, FL (US)

(*) Notice: Subject to any disclaimer, the term of this patent is extended or adjusted under 35 U.S.C. 154(b) by 518 days.

(21) Appl. No.: 13/070,668

(22) Filed: Mar. 24, 2011

(51) Int. Cl.
*G06F 17/50* (2006.01)

(52) U.S. Cl.
USPC .......................................................... 703/1

(58) Field of Classification Search
USPC .......................................................... 703/1
See application file for complete search history.

(56) References Cited

U.S. PATENT DOCUMENTS

| | | | | |
|---|---|---|---|---|
| 5,455,778 A | * | 10/1995 | Ide et al. ............................ 703/1 |
| 7,238,008 B2 | * | 7/2007 | Bobo et al. .................. 416/220 R |
| 2004/0243310 A1 | * | 12/2004 | Griffin et al. .................... 702/10 |
| 2007/0083338 A1 | * | 4/2007 | Griffin et al. .................... 702/56 |
| 2010/0119371 A1 | * | 5/2010 | Heinz-Schwarzmaier et al. ............................ 416/182 |

OTHER PUBLICATIONS

Meng Zhang, Xiaofang Wang, Yan Liu, "Influence of Rotor Axial Shifting and Clearance on Leakage in Stepped Seal in Steam Turbines" IEEE 2010, 4 pages.*

* cited by examiner

*Primary Examiner* — Dwin M Craig
(74) *Attorney, Agent, or Firm* — John Ryznic

(57) ABSTRACT

A process for designing a labyrinth seal for flutter avoidance in which a computer generated Finite Element model of the lab seal is produced, the geometric parameters of the lab seal is determined, the lab seal flow parameters are determined, the solid model of the lab seal is analyzed using a finite element analysis program for a range of nodal diameters to determine frequencies and mode shapes, an aerodynamic damping and mechanical damping for the labyrinth seal is determined, and if the sum of the aerodynamic and mechanical damping is negative one or more of the labyrinth seal parameters are changed and the analysis is repeated.

6 Claims, 6 Drawing Sheets

PROCESS FOR ANALYZING A LABYRINTH SEAL FOR FLUTTER

GOVERNMENT LICENSE RIGHTS

None.

CROSS-REFERENCE TO RELATED APPLICATIONS

None.

BACKGROUND OF THE INVENTION

1. Field of the Invention

The present invention relates generally to labyrinth seal, and more specifically to a process for designing a labyrinth seal in which flutter in the lab seal is minimized.

2. Description of the Related Art including information disclosed under 37 CFR 1.97 and 1.98

Knife-edge seals, also known as Labyrinth seals or lab seals are commonly used in turbo-machinery applications such as a gas turbine engine. Lab seals are used in annular cavities between rotating and stationary components to control leakage flow rates between high pressure and low pressure cavities. The flow through the lab seal is a function of the geometry and pump (or engine) flow parameters at the inlet and discharge ends. The geometry parameters include the following: the number of knife-edges; the knife-edges axial spacing; the knife-edge radius from the rotating centerline; the volume of the cavities formed between adjacent knife-edges; and the radial clearances between the knife-edges and the seal land.

The pump or engine parameters that effect seal leakage are the seal clearances, the fluid temperature and pressure of the upstream and downstream cavities and the rotor speed. The steady state parameters that affect the flow also affect the dynamic response characteristics of the seal. Jet engine experiences have many cases in which knife-edge seal failures were due to high cycle fatigue (HCF). The sources of the dynamic excitations are attributed to one or more of the following: mechanical response due to flow path drivers or rotor dynamics; acoustic resonances that match the structural frequencies and mode shapes; and aero-elastic instability or flutter in which the mechanical deflections of the seal causes unsteady pressure loads that add work to the seal cycle over cycle with insufficient dissipation leading to large amplitude destructive vibratory stresses.

BRIEF SUMMARY OF THE INVENTION

A process for analyzing a labyrinth seal for flutter in order to minimize or eliminate flutter from occurring in the lab seal. The process includes analysis of a computer generated model (such as an axi-symmetric or a 3D solid model) of the lab seal using a finite element analysis (FEA) program for a range of nodal diameters to determine frequencies and mode shapes, from the FEA determine knife edge radial deflections for each nodal diameter, determine the unsteady cavity pressures and flow rates for each of the cavities in the lab seal, determine the aerodynamic damping based on the work done per cycle by the unsteady pressure on the lab seal deflected shape from the different nodal diameters, a plot is produced of the aerodynamic damping versus the nodal diameter, determine a level of available system mechanical damping such as from bolted connections, material, and damping treatment, and determine a stability limit based on the aerodynamic damping and the structural (mechanical) damping. If the total damping is positive, then stop the analysis. If the total damping is negative, then change one or more parameters of the lab seal and repeat the analysis.

DETAILED DESCRIPTION OF THE INVENTION

Current unsteady Computational Fluid Dynamics (CFD) methods are too tedious and time consuming for the purpose of designing a flutter-free labyrinth seal. Often, turbo-machinery designers resort to adding passive damping devices such as split ring dampers to avoid the need for elaborate and time consuming CFD analysis or ad hoc damping augmentation devices that add weight and increase maintenance cost.

Figure 1:
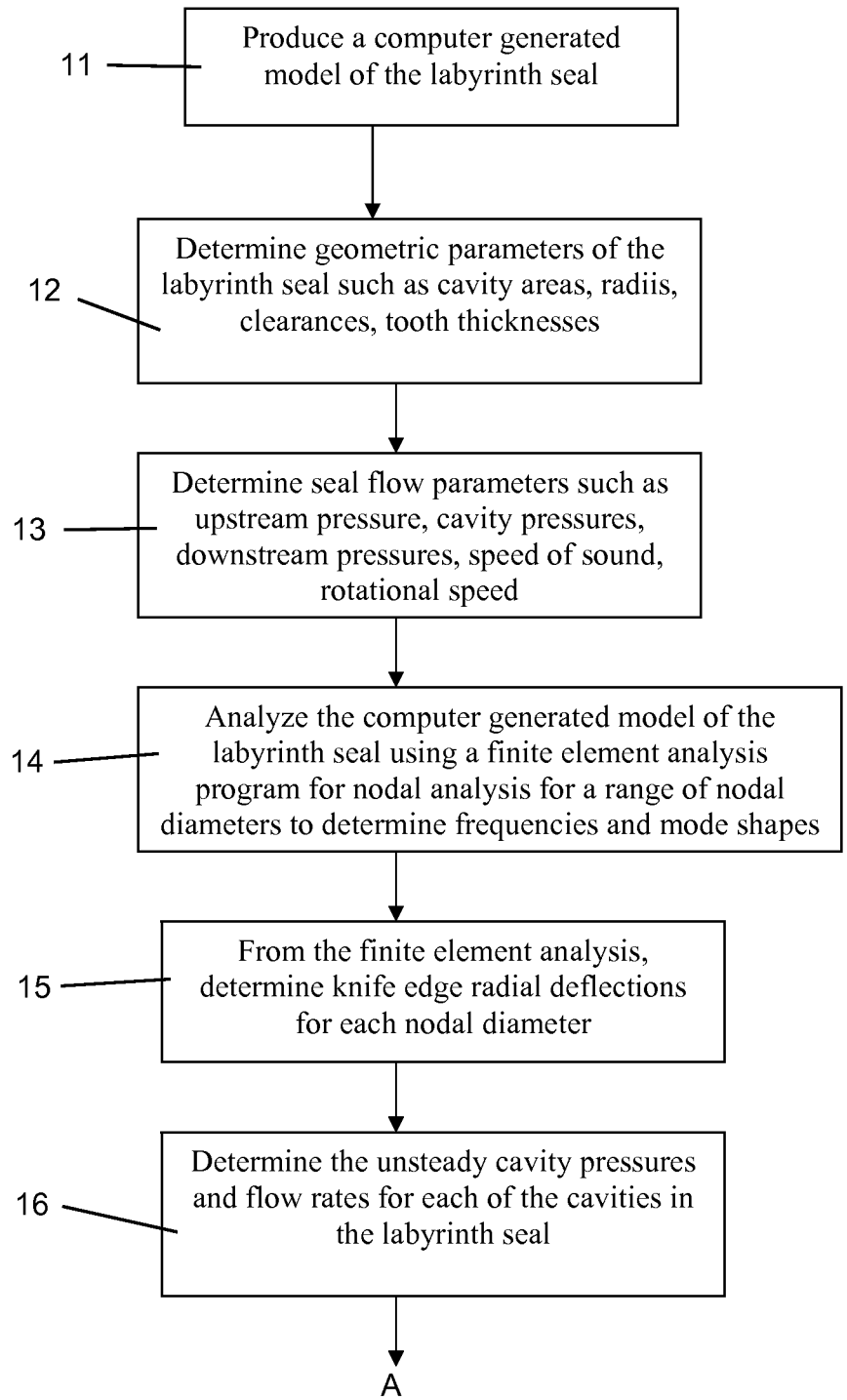
FIGS. 1 and 2 shows a flow chart of the process for analyzing a lab seal for flutter according to the present invention.
Figure 2:
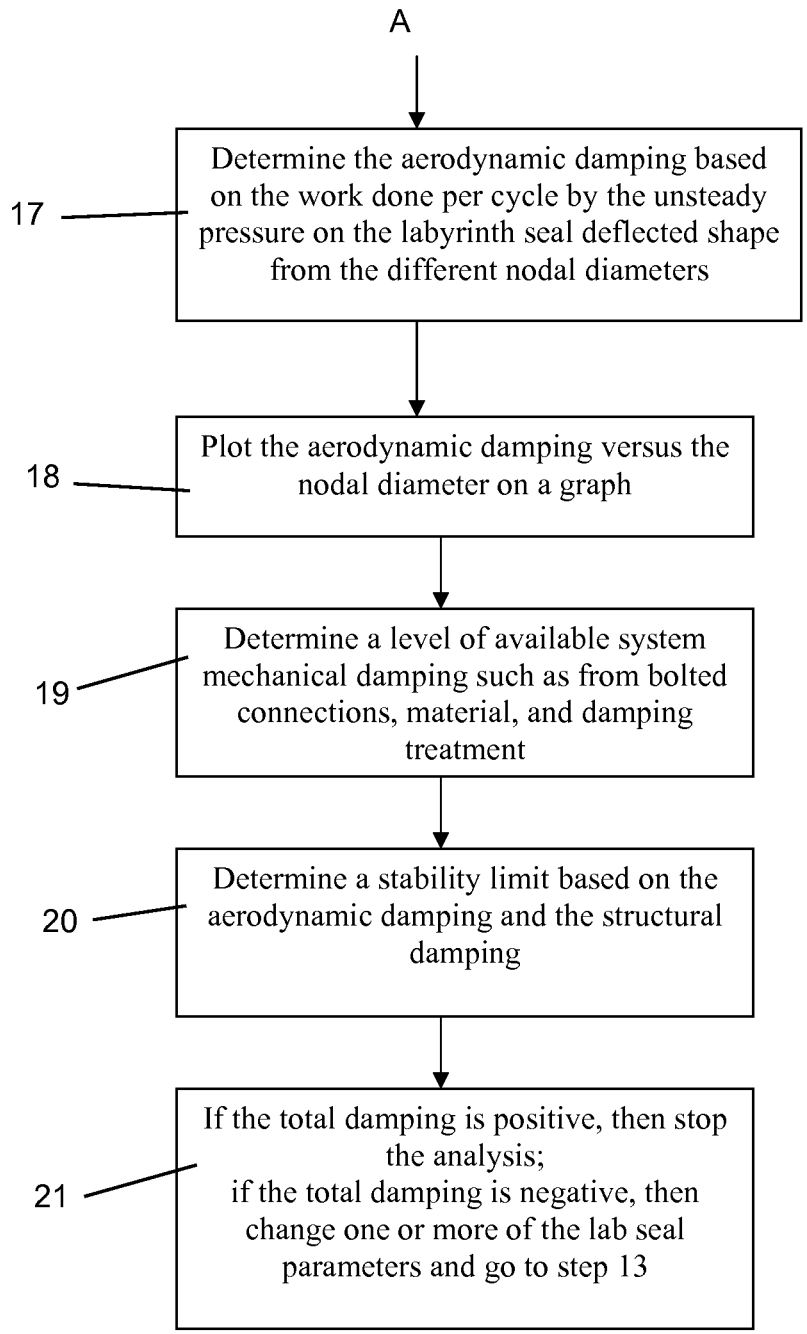

The basic formulation is described in the process depicted by the flow chart in FIGS. 1 and 2. The labyrinth seal is idealized by a series of annular cavities between the rotating and stationary parts with the prescribed clearances at the lips of the knife-edges. If either of the rotating or stationary seal components vibrates in a mode that changes the knife-edge clearances, internal cavity pressures will fluctuate accordingly. The basic approach to evaluating the magnitude of the unsteady pressure fluctuations associated with harmonic seal motion is based on the Egli's lip flow characteristics. In addition, flow conservation laws for continuity and momentum as well as periodicity in the circumferential direction are used to determine the magnitude and phase of the unsteady lip flows and unsteady cavity pressures. The stability of the seal is determined by the energy transfer from the fluid to the seal structure. This is evaluated by the integrated product of the unsteady pressures and cavity walls normal displacement over one cycle of vibration. The calculated work/cycle is then converted to an equivalent damping coefficient where the work/cycle equals the sum of the work done by the unsteady pressures in each cavity as they respond to seal motion in a particular mode.

Seal stability can thus be evaluated for all relevant modes that involve knife-edge seal motion. The system stability is governed by the overall system damping which includes both the fluid damping as well as damping from other sources like material damping, friction damping at bolted connections and other interfaces, and damping devices, if present. This additional mechanical damping is generally hard to quantify because of its dependency on boundary conditions and the specific mode of vibration. Therefore, designers strive to produce designs that have positive fluid damping without reliance on mechanical damping.

The approach to conducting a seal flutter analysis starts by examining the seal structural dynamic characteristics, namely frequencies and mode shapes for the different nodal diameter patterns. A rotationally symmetric structure has many modes for each diametral pattern. Modes with high dynamic deflections at the knife-edges are susceptible to flutter due to the increased potential of generating high unsteady cavity pressures. Modes of vibration are prescribed based on Finite Element modal analysis. Incorporation of the rotation effect results in different levels of the fluid damping associated with forward and backward traveling waveforms.

Figure 3:
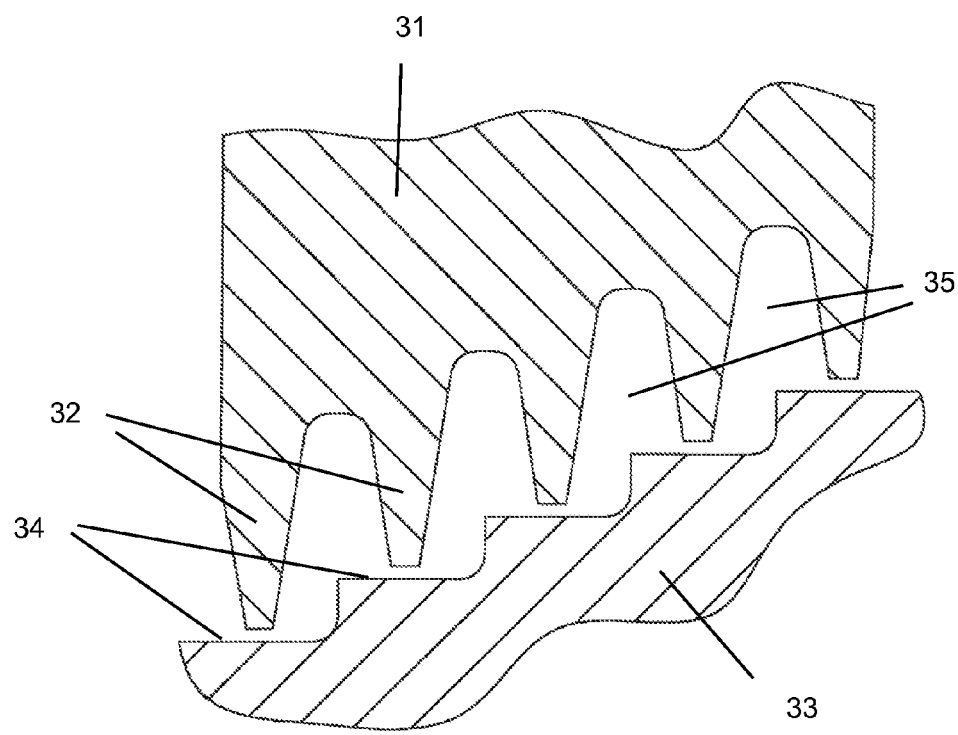
FIG. 3 shows a stepped labyrinth seal in which the process of the present invention is used.

FIG. 3 shows a stepped labyrinth seal with a rotating part 31 and a stationary part 33. In other labyrinth seals, the rotating part and the stationary part can be switched so that the teeth of the lab seal extend from the stationary part. The process for analyzing a lab seal for flutter can be used for stepped or non-stepped lab seals. FIG. 3 shows a lab seal with a number of teeth extending from the rotating part 31 in which each of the teeth include a lip that forms a small gap with a surface of the opposite part which in this case is the stationary part 33. Each adjacent teeth form a cavity 35.

Figure 4:
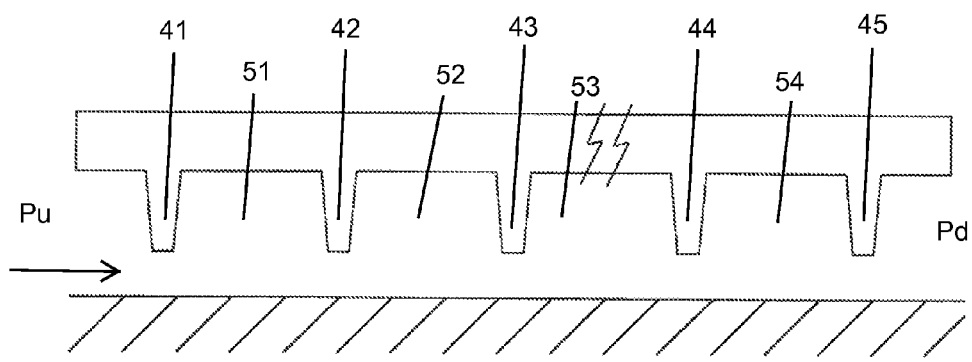
FIG. 4 shows a schematic view of a lab seal with multiple teeth forming cavities in which the process of the present invention is used.

FIG. 4 shows a schematic view of a multiple tooth lab seal with five teeth (41-45) forming four cavities (51-54) with an upstream pressure (Pu) and a downstream pressure (Pd) in which the flow through the lab seal is from left to right as represented by the arrow in FIG. 4. Other lab seal embodiments with more or less teeth forming more or less cavities can be used with the process of the present invention.

Figure 5:
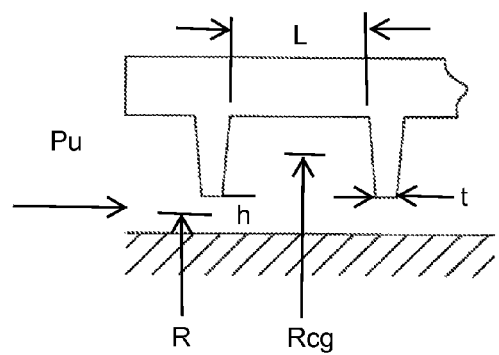
FIG. 5 shows two adjacent teeth in the lab seal of FIG. 4 with the various parameters used in the process of the present invention.

FIG. 5 shows a section of the FIG. 4 lab seal with two adjacent teeth with the representations of the parameters used in the process. An axial spacing between adjacent teeth is (L), a distance from the engine centerline to the mean gap height is (R), a height of the gap is (h), a distance from the center of gravity of the cavity to the rotational axis is (Rcg), and a thickness of the tooth at the lip is (t).

The process is shown in FIGS. 1 and 2 and begins with step 11 in which a 3D solid model (computer generated) of the labyrinth seal is produced. step 12 is to determine the geometric parameters of the lab seal such as cavity areas, radius of the different teeth (R for each tooth), clearances (h) of the gaps, and tooth thicknesses (t). Step 13 is then to determine seal flow parameters such as upstream pressure (Pu), cavity pressures, downstream pressures (Pd), speed of sound within the fluid, and rotational speed.

Figure 7:
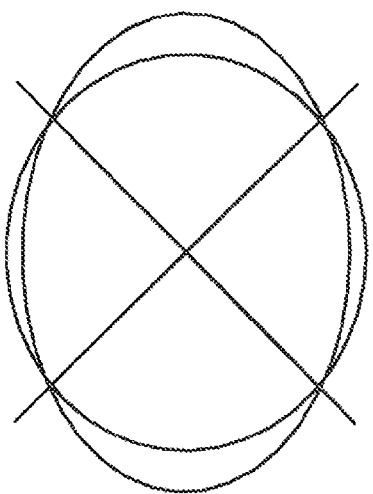
FIGS. 7 and 8 shows two different nodal diameter patterns.
Figure 8:
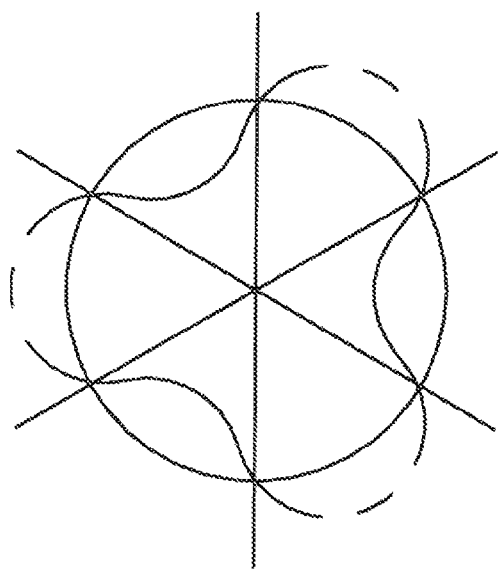

Step 14 is to analyze the 3D solid model of the lab seal using a finite element analysis (FEA) program for modal analysis for a range of nodal diameters to determine frequencies and mode shapes. In step 15, from the FEA, determine knife edge radial deflections for each nodal diameter. FIGS. 7 and 8 show two different nodal diameter patterns. In FIG. 7, the nodal pattern is 2 while in FIG. 8 the circumferential nodal pattern is 3. In step 16, determine the unsteady cavity pressures and flow rates for each of the cavities in the lab seal.

Figure 6:
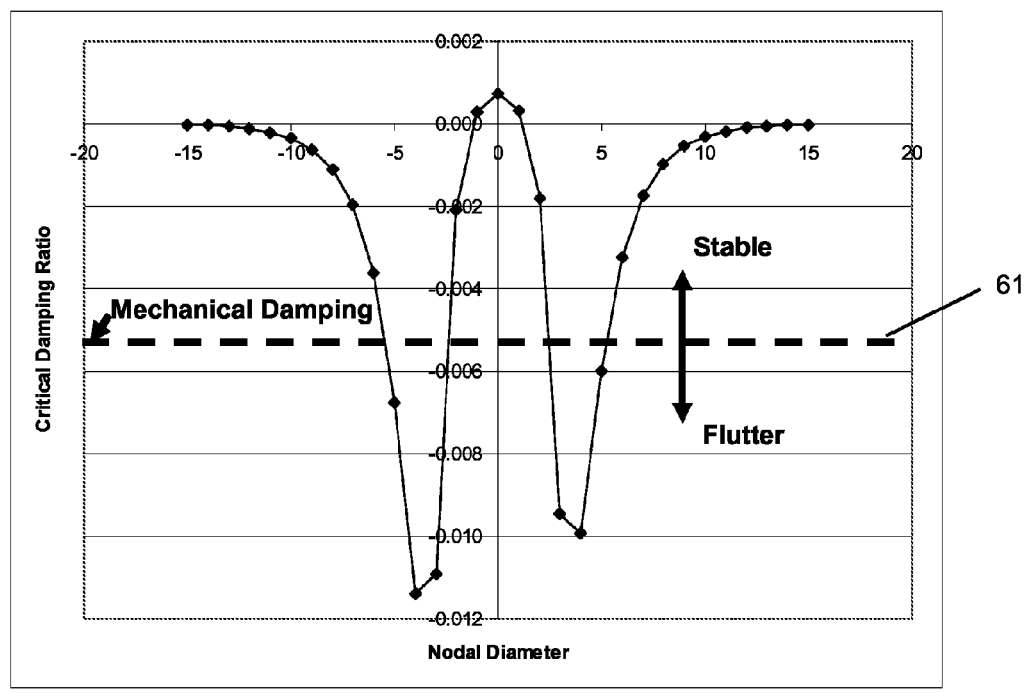
FIG. 6 shows a graph of the critical damping ratio versus the nodal diameter used in the process of the present invention.

In step 17 (shown in FIG. 2), determine the aerodynamic damping based on the work done per cycle by the unsteady pressure on the lab seal deflected shape from the different nodal diameters. In step 18, a plot is produced of the aerodynamic damping versus the nodal diameter on a graph as seen in FIG. 6. In step 19, determine a level of available system mechanical damping such as from bolted connections, material, and damping treatment. This includes all of the mechanical damping features associated with the lab seal. This available system mechanical damping would be represented on the graph in FIG. 6 as the dashed line 61.

Next in step 20, determine a stability limit based on the aerodynamic damping and the structural (mechanical) damping. If the total damping is positive (step 21), then stop the analysis. If the total damping is negative, then change one or more parameters of the lab seal and repeat the analysis beginning at step 13. From the graph in FIG. 6, if the lowest dip on the up and down line is above the mechanical damping line 61, then the seal can be considered stable and the analysis can be stopped.

We claim the following:

1. A process for designing a labyrinth seal for flutter comprising the steps of:
    produce a computer generated model of a labyrinth seal;
    determine geometric parameters of the labyrinth seal;
    determine seal flow parameters of the labyrinth seal;
    analyze the computer generated model of the labyrinth seal using a finite element analysis program for modal analysis for a range of nodal diameters to determine frequencies and mode shapes of the labyrinth seal;
    determine an aerodynamic damping of the labyrinth seal for the different nodal diameters;
    determine a level of mechanical damping of the labyrinth seal;
    if the sum of the aerodynamic damping and the mechanical damping of the labyrinth seal is negative, then change one or more of the labyrinth seal parameters and redo the analysis; and,
    if the sum of aerodynamic damping and the mechanical damping of the labyrinth seal is positive, then stop the analysis of the labyrinth seal.

2. The process for designing a labyrinth seal of claim 1, and further comprising the step of:
    the step of determining geometric parameters of the labyrinth seal includes determining cavity areas, radii's, clearances, and tooth thicknesses.

3. The process for designing a labyrinth seal of claim 1, and further comprising the step of:
    The step of determining seal flow parameters of the labyrinth seal includes using upstream pressures, cavity pressures, downstream pressures, speed of sound, and rotational speed.

4. The process for designing a labyrinth seal of claim 1, and further comprising the step of:
    The step of determining an aerodynamic damping of the labyrinth seal for the different nodal diameters is based on a work done per cycle by an unsteady pressure on the labyrinth seal deflected shape.

5. The process for designing a labyrinth seal of claim 1, and further comprising the step of:
    from the finite element analysis, determine knife edge radial deflections for each nodal diameter of the labyrinth seal.

6. The process for designing a labyrinth seal of claim 1, and further comprising the step of:
    prior to the step of determining an aerodynamic damping of the labyrinth seal deflected shape, determine an unsteady cavity pressures and flow rates for each of the cavities in the labyrinth seal.

* * * * *